US008947149B1

(12) United States Patent
Kapoor et al.

(10) Patent No.: US 8,947,149 B1
(45) Date of Patent: Feb. 3, 2015

(54) STACKED CLOCK DISTRIBUTION FOR LOW POWER DEVICES

(71) Applicant: NXP B.V., Eindhoven (NL)

(72) Inventors: Ajay Kapoor, Veldhoven (NL); Ralf Malzahn, Seevetal (DE); Rinze Ida Mechtildis Peter Meijer, Herkenbosch (NL); Peter Thueringer, Graz (AT)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/136,137

(22) Filed: Dec. 20, 2013

(51) Int. Cl.
*G06F 1/04* (2006.01)
*H03K 3/012* (2006.01)

(52) U.S. Cl.
CPC ........................... *H03K 3/012* (2013.01)
USPC ...................... 327/297; 327/293; 327/295

(58) Field of Classification Search
USPC ................... 327/291, 293, 295, 297
See application file for complete search history.

(56) References Cited

U.S. PATENT DOCUMENTS 5,850,157 A * 12/1998 Zhu et al. ............... 327/295

OTHER PUBLICATIONS

Liu, Dake et al.; "Power Consumption Estimation in CMOS VLSI Chips"; IEEE Journal of SOlid-State Circuits, vol. 29, No. 6; pp. 663-670; Jun. 1994.
Friedman, Eby G.; "Clock Distribution Networks in Synchronous Digital Integrated Circuits"; Proceedings of the IEEE, vol. 89, No. 5; pp. 665-692; May 2001.
Tawfik, Sherif A. et al.; "Dual-VDD Clock Distribution for Low Power and Minimum Temperature Fluctuations Induced Skew"; Proceedings of the 6th International Symposium on Quality Electronic Design (ISQED'07); 6 pgs; 2007.

Mohammad, Khader et al.; "Reduced Voltage Scaling in Clock Distribution Networks"; VLSI Design, vol. 2009, Article ID 679853; 7 pages; 2009.
Zhang, Hui et al.; "Low-Swing On-Chip Signaling Techniques: Effectiveness and Robustness"; IEEE Transactions on very large scale integration (VLSI) Systems, vol. 8, No. 3; pp. 264-272; Jun. 2000.
Asgari, Farhad Haj Ali et al.; "A Low-Power Reduced Swign Global Clocking Methodology"; IEEE Transactions on very large scale integration (VLSI) systems, vol. 12, No. 5; pp. 538-545; May 2004.
Pagjun, Jatuchai et al.; "Low Power Clock Distribution using multiple voltages and reduced swings"; IEEE Transactions on VLSI Systems; 18 pgs.; 2002.
Mahoney, Patrick et al.; "Clock Distribution on a Dual-Core, Multi-Threaded Itanium Family Processor"; IEEE International Solid-state Circuits Conference; 3 pgs.; 2005.
Rajapandian, Saravanan et al.; "Charge-Recycling Voltage Domains for Energy-Efficient Low-Voltage Operation of Digital CMOS Circuits"; Proceedings of the 21st International Conference on Computer Design (ICCD'13); 5 pgs.; 2003.
Liu, C et al.; "Voltage Regulation of CMOS Stacked Digital Circuits"; Aug. 30, 2010.
Gu, Jie et al.; "Multi-Story Power Delivery for Supply Noise Reduction and Low Voltage Operation"; ISLPED'05, San Diego, CA; pp. 192-197; 2005.

* cited by examiner

*Primary Examiner* — An Luu (57) ABSTRACT

Embodiments of a clock distribution device and a method of clock distribution are described. In one embodiment, a clock distribution device includes a stacked clock driver circuit configured to perform clock signal charge recycling on input clock signals that swing between different voltage ranges and a load circuit. The stacked clock driver circuit includes stacked driver circuits configured to generate output clock signals that swing between the different voltage ranges. The load circuit includes load networks of different semiconductor types. Each of the load networks are configured to be driven by one of the output clock signals. Other embodiments are also described.

20 Claims, 7 Drawing Sheets

STACKED CLOCK DISTRIBUTION FOR LOW POWER DEVICES

Embodiments of the invention relate generally to electronic hardware and methods for operating electronic hardware, and, more particularly, to clock circuits and methods for operating clock circuits.

The power consumption of an electronic circuit is a critical performance metric of the electronic circuit. For low power embedded devices such as microcontrollers and sensors, smartcards and medical devices, reducing the power consumption is critical to the performance of the device. For example, clock distribution networks of some digital devices can account for a significant portion (e.g., up to 50%) of the overall power consumption of the digital devices. In electronic circuits such as microcontrollers, contactless smart cards, and hearing aids, a significant portion of power is consumed in clock lines. The total power dissipation in a clock distribution network is attributable to leakage current, short-circuits, and dynamic power consumption. Power consumption by leakage current is generally relatively small in a clock distribution network. However, the clock distribution network usually has high switching activity and large switching capacitance, which causes significant dynamic power consumption in the clock lines. For example, power is consumed in clock lines because of the high switching activity of the clock signals or line/wire capacitances and terminal capacitive load. Moreover, the large number of switching clock buffers can cause noticeable short-circuit power consumption in the clock distribution network. Reducing power consumption in the clock distribution network of an electronic circuit can lower the overall power consumption of the electronic circuit. Therefore, it is desirable to reduce the power consumption of a clock distribution network in an electronic circuit.

Embodiments of a clock distribution device and a method of clock distribution are described. In one embodiment, a clock distribution device includes a stacked clock driver circuit configured to perform clock signal charge recycling on input clock signals that swing between different voltage ranges and a load circuit. The stacked clock driver circuit includes stacked driver circuits configured to generate output clock signals that swing between the different voltage ranges. The load circuit includes load networks of different semiconductor types. Each of the load networks are configured to be driven by one of the output clock signals. Compared to a conventional clock distribution device, the clock distribution device performs charge/energy recycling to improve energy efficiency and reduces power consumption in clock lines. Other embodiments are also described.

In an embodiment, a method for clock distribution involves performing clock signal charge recycling on input clock signals that swing between different voltage ranges, which includes generating output clock signals that swing between the different voltage ranges, and driving each of a plurality of load networks of different semiconductor types by one of the output clock signals.

In an embodiment, a clock distribution device includes a stacked clock driver circuit configured to perform clock signal charge recycling on input clock signals and a load circuit including a PMOS load network having only PMOS transistors and an NMOS load network having only NMOS transistors. The stacked clock driver circuit includes a first-half driver circuit configured to receive a first input clock signal that swings between a voltage threshold and one half of the voltage threshold and to generate a first output clock signal that swings between the voltage threshold and one half of the voltage threshold and a second-half driver circuit connected to the first-half driver circuit and configured to receive a second input clock signal that swings between one half of the voltage threshold and zero and generate a second output clock signal that swings between one half of the voltage threshold and zero. The PMOS load network is configured to be driven by the first output clock signal. The NMOS load network is configured to be driven by the second output clock signal.

Other aspects and advantages of embodiments of the present invention will become apparent from the following detailed description, taken in conjunction with the accompanying drawings, depicted by way of example of the principles of the invention.

Throughout the description, similar reference numbers may be used to identify similar elements.

It will be readily understood that the components of the embodiments as generally described herein and illustrated in the appended figures could be arranged and designed in a wide variety of different configurations. Thus, the following detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
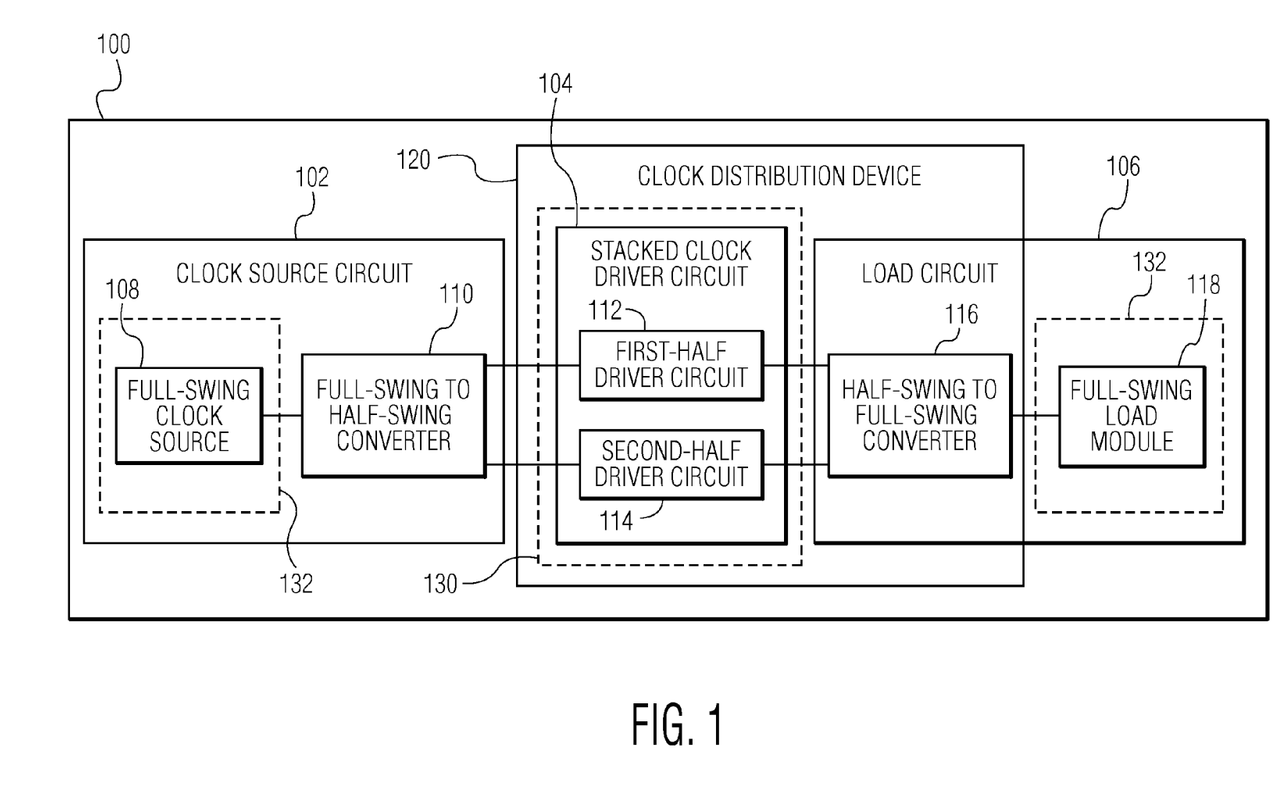
FIG. 1 is a schematic block diagram of an IC device in accordance with an embodiment of the invention.

FIG. 1 is a schematic block diagram of an IC device 100 in accordance with an embodiment of the invention. In the embodiment depicted in FIG. 1, the IC device includes a clock source circuit 102, a stacked clock driver circuit 104, and a load circuit 106. The IC device can be used in various applications, such as automotive applications, communications applications, industrial applications, medical applications, computer applications, and/or consumer or appliance applications. The IC device can be implemented in a substrate, such as a semiconductor wafer or a printed circuit board (PCB). In an embodiment, the IC device is packaged as a semiconductor IC chip. The IC device may be included in a microcontroller, which can be used for, for example, in device control, identification, and/or wireless communications. In some embodiments, the IC device is included in a contactless smart card or hearing aids. Although the IC device 100 is shown in FIG. 1 as including certain components, in some embodiments, the IC device includes less or more components to implement less or more functionalities. For example, the IC device may include serially connected clock buffers.

Compared to a conventional IC device that drives load using full-swing clock signals, the IC device 100 depicted in FIG. 1 reduces power consumption in clock-lines due to high switching activity or due to high load capacitance, for example, by converting a full-swing clock signal into half-swing clock signals and driving load elements using half-swing clock signals. For example, the IC device depicted in FIG. 1 converts a full-swing clock signal of a voltage that is between 0 and "VDD," into half-swing clock signals that are between 0 and "VDD/2," and between "VDD/2," and "VDD," and driving load elements separately using these half-swing clock signals. Because the IC device can operate on low swing clocking, power consumption in the clock-lines can be reduced. Consequently, the overall power consumption of the IC device can be reduced. Compared to a conventional stacked logic circuit, the IC device 100 depicted in FIG. 1 can operate in both a half-swing clock domain for reducing power consumption in the clock-lines and a full-swing clock domain for high performance. Specifically, parts of the IC device (e.g., the stacked clock driver circuit 104) operate in a half-swing clock domain while critical paths (e.g., the clock source circuit 102 and high performance components of the load circuit 106) of the IC device operate in a full-swing clock domain. In addition, the IC device uses stacked circuits to recycle charge, which improves energy-efficient chip operation. The IC device can be implemented in a fully static CMOS based solution with no need for explicit level shifting logic.

Traditional techniques for reducing the digital power consumption, such as supply voltage scaling approaches or reduced supply voltage operation, typically provide only limited benefits. In order to minimize system complexity related to power management infrastructure, digital logic and memories are usually part of the same power supply domain to avoid the overhead of maintaining an additional power domain. In some situations, parts of the system with lower performance demand can operate at a lower supply voltage to save energy. However, there is an overhead in generation of an additional power supply. In general, the overhead is proportional to the required current driving capability of this additional power supply. Additionally, extra level conversion logic may be required to transform signals from one voltage domain to another. Moreover, the higher performing circuit parts of a digital system typically consume the most power.

Referring again to FIG. 1, the clock source circuit 102 of the IC device 100 includes a full-swing clock source 108 and a full-swing to half swing converter 110. The full-swing clock source is configured to generate a full-swing clock signal. In an embodiment, the full-swing clock source is configured to generate a clock signal that is switched between 0 volt and a voltage threshold. The full-swing to half swing converter is configured to convert the clock signal from the full-swing clock source into a half-swing clock signal. In an embodiment, the full-swing to half swing converter is configured to convert the clock signal from the full-swing clock source into half-swing clock signals that are switched between 0 volt and half of the voltage threshold and between half of the voltage threshold and the voltage threshold.

The stacked clock driver circuit 104 of the IC device is configured to perform clock signal charge recycling on input clock signals that swing between different voltage ranges. In an embodiment, the stacked clock driver circuit includes multiple stacked driver circuits configured to generate output clock signals that swing between the different voltage ranges. In the embodiment depicted in FIG. 1, the stacked clock driver circuit 104 includes a first-half driver circuit 112 and a second-half driver circuit 114. The stacked clock driver circuit allows charge/energy recycling on clock signals to improve energy efficiency of the IC device. Specifically, the first-half driver circuit and the second-half driver circuit have similar switching activities. Consequently, the charge required by one half of the stacked clock driver circuit is identical to the charge that is required by the other half of the stacked clock driver circuit, which enables charge recycling between the first-half driver circuit and the second-half driver circuit. Because charge from one half of the stacked clock driver circuit can be reused to charge the other half of the stacked clock driver circuit, the power consumption of the IC device 100 can be reduced. The charge recycling results in a minimal difference in currents that flow through the first-half driver circuit and the second-half driver circuit. Consequently, the stacked clock driver circuit can be derived with a low driving voltage, which reduces short circuit current and leakage and voltage overhead (e.g., no static current consumption). For example, a driving voltage of half of the maximum swing voltage of a full-swing clock signal can be used to drive the stacked clock driver circuit.

Figure 2:
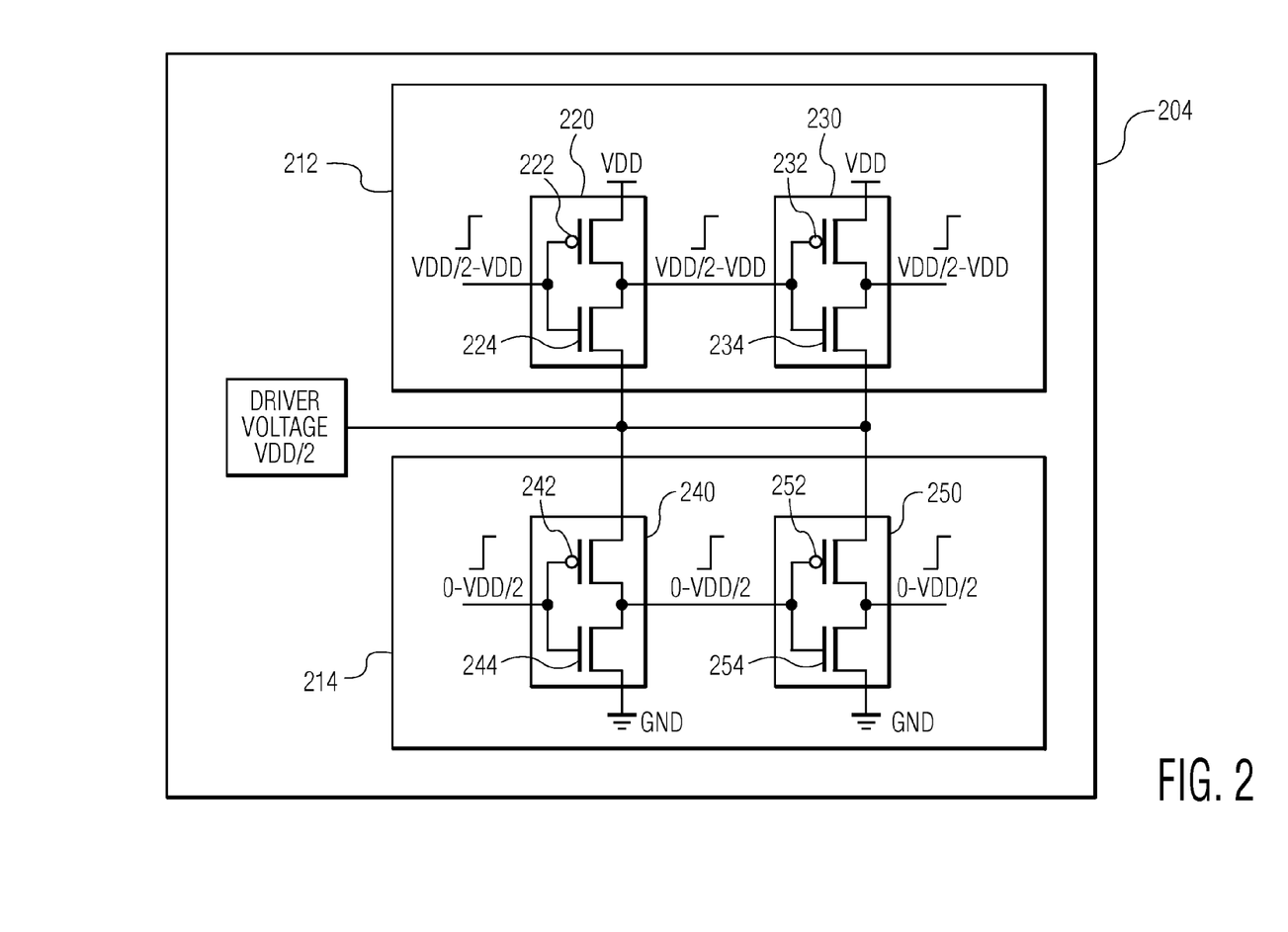
FIG. 2 depicts an embodiment of the stacked clock driver circuit depicted in FIG. 1.

FIG. 2 depicts an embodiment of the stacked clock driver circuit 104 depicted in FIG. 1. The stacked clock driver circuit 204 depicted in FIG. 2 is one possible embodiment of the stacked clock driver circuit 104 depicted in FIG. 1. However, the stacked clock driver circuit 104 depicted in FIG. 1 is not limited to the embodiment shown in FIG. 2.

In the embodiment depicted in FIG. 2, the stacked clock driver circuit 204 includes an upper-half driver circuit 212 and a lower-half driver circuit 214. The upper-half driver circuit includes two inverters 220, 230 that are coupled to a supply voltage, "VDD," and to a drive voltage, "VDD/2." Each inverter 220 or 230 of the upper-half driver circuit includes a PMOS transistor 222, 232 and an NMOS transistor 224, 234. The upper-half driver circuit receives an input clock signal that swings between a voltage, "VDD/2," and a voltage, "VDD," and generates an output clock signal that swings between the voltage, "VDD/2," and the voltage, "VDD." The lower-half driver circuit 214 includes two inverters 240, 250 that are coupled to the ground and to the drive voltage, "VDD/

2." Each inverter 240 or 250 of the lower-half driver circuit includes a PMOS transistor 242, 252 and an NMOS transistor 244, 254. The lower-half driver circuit receives an input clock signal that swings between zero and a voltage, "VDD/2," and generates an output clock signal that swings between zero and the voltage, "VDD/2." The upper-half driver circuit and the lower half driver circuit have similar switching activities. The charge required by one section of the stacked clock driver circuit is identical to the charge that is required by the other section of the stacked clock driver circuit, which causes the charge recycling. The charge recycling results in a minimal difference in currents that flow through the upper-half driver circuit and the lower-half driver circuit. Consequently, the stacked clock driver circuit can be derived with a voltage source with a voltage of "VDD/2," which causes very limited overhead.

Compared to a conventional non-stacked driver circuit, the stacked clock driver circuit 204 does not result in additional load components or capacitances. Specifically, the load capacitance of the stacked clock driver circuit is decomposed into P-network capacitance and N-network capacitance. Each of the upper-half driver circuit 212 and the lower-half driver circuit 214 drives either the P-network capacitance or the N-network capacitance. The total driving capacitance for the stacked clock driver circuit is the same as the total driving capacitance for a conventional non-stacked driver circuit. Consequently, compared to a conventional non-stacked driver circuit, the stacked clock driver circuit 204 does not result in extra overhead in load capacitances.

Turning back to FIG. 1, the load circuit 106 of the IC device 100 includes a half-swing to full-swing converter 116 and a full-swing load module 118. The stacked clock driver circuit 104 and the half-swing to full-swing converter form a clock distribution device 120. The load circuit may be implemented in one or more Complementary metal-oxide-semiconductor (CMOS) inverters, NANDs, NORs, and/or other suitable semiconductor elements. In an embodiment, the load circuit includes multiple load networks of different semiconductor types. In this embodiment, each of the load networks is configured to be driven by one of the output clock signals from the stacked clock driver circuit 104. For example, in the half-swing to full-swing converter, the terminal load can be decomposed into a PMOS load network and an NMOS load network. The PMOS load network may include one or more PMOS transistors while the NMOS load network may includes one or more NMOS transistors. In an embodiment, the PMOS load network includes only PMOS transistors while the NMOS load network includes only NMOS transistors. The NMOS load network can be driven by a signal swinging from 0 to VDD/2. Similarly, the PMOS load network is driven by a signal swinging from VDD/2 to VDD. In the embodiment depicted in FIG. 1, the upper-half driver circuit drives the PMOS-load network and the lower-half driver circuit drives the NMOS-load network.

Figure 3:
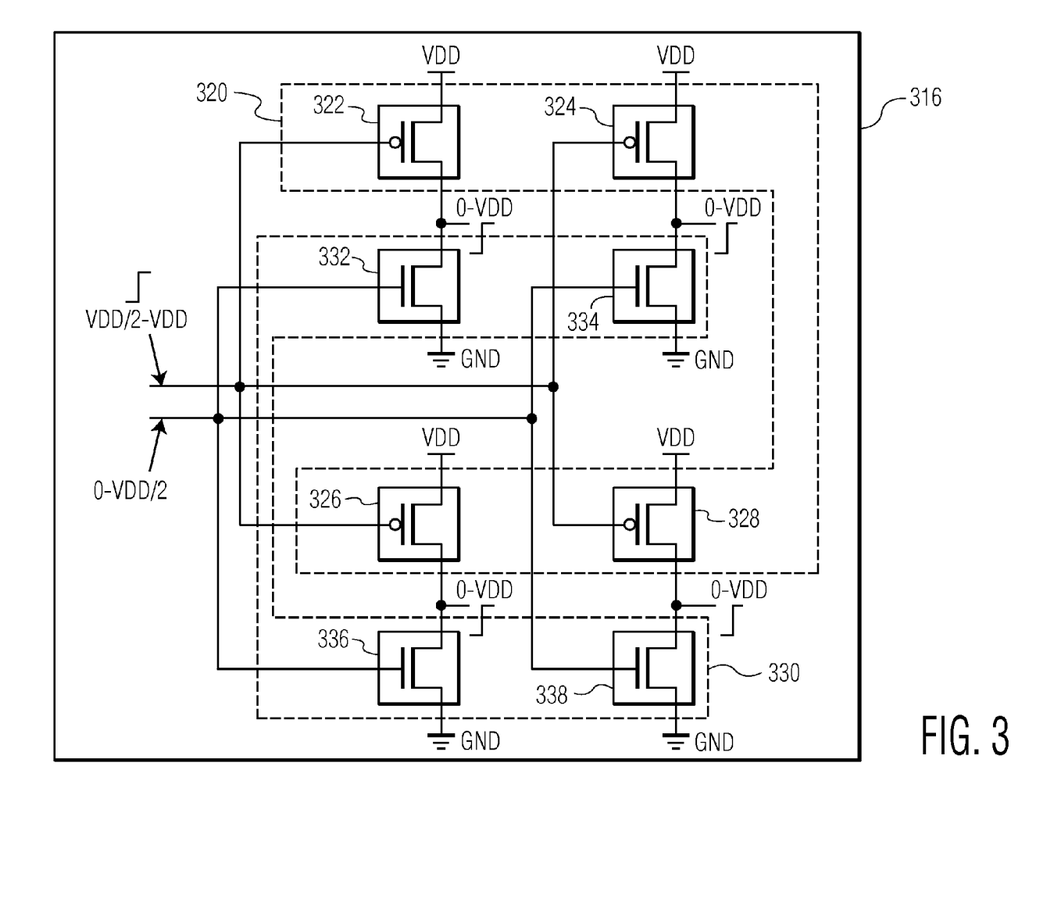
FIG. 3 depicts an embodiment of the half-swing to full-swing converter depicted in FIG. 1.

FIG. 3 depicts an embodiment of the half-swing to full-swing converter 116 depicted in FIG. 1. The half-swing to full-swing converter 316 depicted in FIG. 3 is one possible embodiment of the half-swing to full-swing converter 116 depicted in FIG. 1. However, the half-swing to full-swing converter 116 depicted in FIG. 1 is not limited to the embodiment shown in FIG. 3. In the embodiment depicted in FIG. 3, the half-swing to full-swing converter 316 includes a PMOS network 320 and a NMOS network 330. The PMOS network 320 includes four PMOS transistors 322, 324, 326, 328 that are coupled to a supply voltage, "VDD." Each PMOS transistor of the PMOS network receives an input clock signal that swings between a voltage, "VDD/2," and a voltage, "VDD."

The NMOS network 330 includes four NMOS transistors 332, 334, 336, 338 that are coupled to the ground. Each NMOS transistor of the PMOS network receives an input clock signal that swings between zero and a voltage, "VDD/2." The half-swing to full-swing converter 316 generates a full-swing output clock signal that swings between zero and the voltage, "VDD."

Turning back to FIG. 1, the full-swing load module 118 of the load circuit 106 can operate as the clock sink point for the IC device 100. Traditional load (e.g., flip-flops) can be used in the full-swing load module. For example, existing library elements (e.g., flip-flops) for conventional clock circuits can be used in the full-swing load module 118 by modifying input buffers of the flip-flops. Consequently, the IC device 100 can be compatible with traditional digital clocking approaches and fully integrated in design flow and design infrastructure with standard digital libraries.

Compared to a conventional clock logic circuit, the IC device 100 depicted in FIG. 1 can operate in both a half-swing clock domain 130 for reducing power consumption in the clock-lines and a full-swing clock domain 132 for high performance. Specifically, the stacked clock driver circuit 104 operates in the half-swing clock domain 130 with half-swing clock signals while the full-swing clock source 108 and the full-swing load module 118 of the load circuit 106 operate in the full-swing clock domain 132 with full-swing clock signals.

Figure 4:
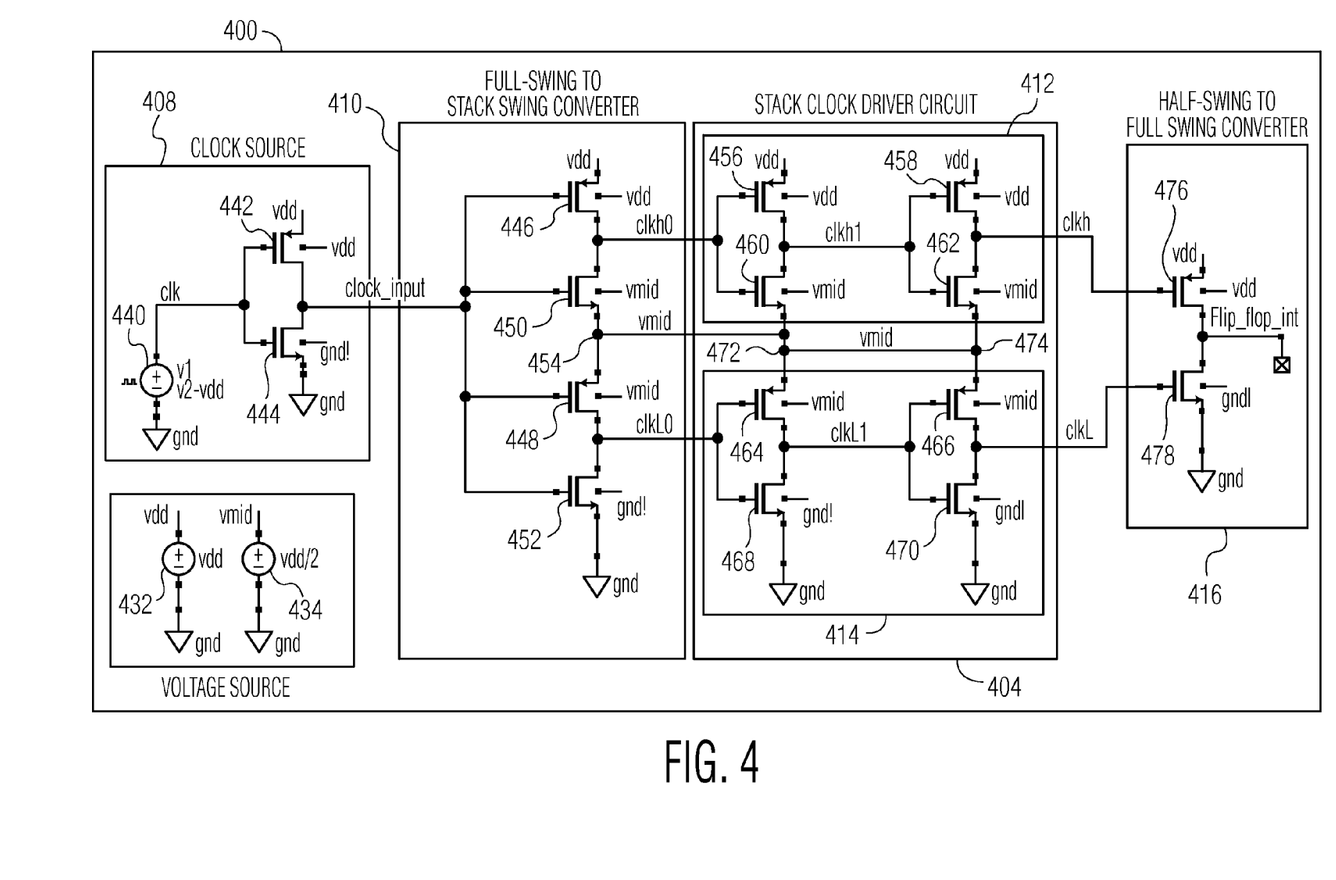
FIG. 4 depicts an embodiment of the IC device depicted in FIG. 1.

FIG. 4 depicts an embodiment of the IC device 100 depicted in FIG. 1. The IC device 400 depicted in FIG. 4 is one possible embodiment of the IC device 100 depicted in FIG. 1. However, the IC device 100 depicted in FIG. 1 is not limited to the embodiment shown in FIG. 4. In the embodiment depicted in FIG. 4, the IC device 400 includes a clock source 408, a full-swing to half-swing converter 410, a stacked clock driver circuit 404, and a half-swing to full-swing converter 416. The voltage source circuit 430 of the IC device 400 includes a voltage source 432 with a supply voltage, "VDD," and a voltage source 434 with a supply voltage, "VMID," which is equal to a half of VDD.

The clock source 408 is a clock signal source with signal swing between 0 and VDD. In the embodiment depicted in FIG. 4, the clock source 408 includes a voltage source 440, a PMOS transistor 442 that is coupled to a supply voltage, "VDD," and an NMOS transistor 444 that is coupled to the ground. The clock source 408 generates a full-swing input clock signal, "clock_input," (swinging between 0 and VDD), which is output to the full-swing to half-swing converter 410.

The full-swing to half-swing converter 410 splits the full-swing clock input signal, "clock_input," into two equal halves represented by, "clk10," and, "clkh0," with a signal swing of 0-VDD/2 and VDD/2-VDD, respectively. In the embodiment depicted in FIG. 4, the full-swing to half-swing converter 410 includes PMOS transistors 446, 448 that are coupled to a supply voltage, "VDD," and NMOS transistors 450, 452 that are coupled to the ground. The PMOS transistors 446, 448 and the NMOS transistors 450, 452 receive the full-swing clock input signal, "clock_input," and generate half-swing signals, "clk10," and "clkh0," with a signal swing of 0-VDD/2 and VDD/2-VDD, respectively. A supply voltage, "VMID," is supplied to a node 454 that is between the PMOS transistor 448 and the NMOS transistor 450.

The stacked clock driver circuit 404 receives the clock signals, "clk10," and, "clkh0," from the full-swing to half-swing converter 410 and generates two half-swing clock signals, "clk1," and "clkh." The stacked clock driver circuit 404 depicted in FIG. 4 is the same as or similar to the stacked clock driver circuit 204 depicted in FIG. 2. In the embodiment depicted in FIG. 4, the stacked clock driver circuit 404 includes an upper-half driver circuit 412 and a lower-half driver circuit 414. The upper-half driver circuit 412 includes PMOS transistors 456, 458 that are coupled to a supply voltage, "VDD," and NMOS transistors 460, 462 that are coupled to a drive voltage, "VMID." The PMOS transistor 456 and the NMOS transistor 460 form an inverter while the PMOS transistor 458 and the NMOS transistor 462 form another inverter. A clock signal, "clkh1," is output from the inverter formed by the PMOS transistor 456 and the NMOS transistor 460 to the inverter formed by the PMOS transistor 458 and the NMOS transistor 462. The clock signal, "clkh," is output from the inverter formed by the PMOS transistor 458 and the NMOS transistor 462 to the half-swing to full-swing converter 416. The lower-half driver circuit 414 includes PMOS transistors 464, 466 that are coupled to a drive voltage, "VMID," and the NMOS transistors 468, 470 that are coupled to the ground. The PMOS transistor 464 and the NMOS transistor 468 form an inverter while the PMOS transistor 466 and the NMOS transistor 470 form another inverter. A clock signal, "clk11," is output from the inverter formed by the PMOS transistor 464 and the NMOS transistor 468 to the inverter formed by the PMOS transistor 466 and the NMOS transistor 470. The clock signal, "clk1," is output from the inverter formed by the PMOS transistor 466 and the NMOS transistor 470 to the half-swing to full-swing converter 416. A supply voltage, "VMID," is supplied to a node 472 that is between the PMOS transistor 464 and the NMOS transistor 460 and a node 474 that is between the PMOS transistor 466 and the NMOS transistor 462.

The half-swing to full-swing converter 416 converts the two half-swing clock signals, "clk1," and "clkh," into a full swing (0-VDD) signal, "flip-flop_int." The half-swing to full-swing converter includes a PMOS transistor 476 that is coupled to a supply voltage, "VDD," and an NMOS transistor 478 that is coupled to the ground. The PMOS transistor 476 and the NMOS transistor 478 form a flip-flop circuit, which outputs the full-swing clock signal, "flip-flop_int."

Figure 5:
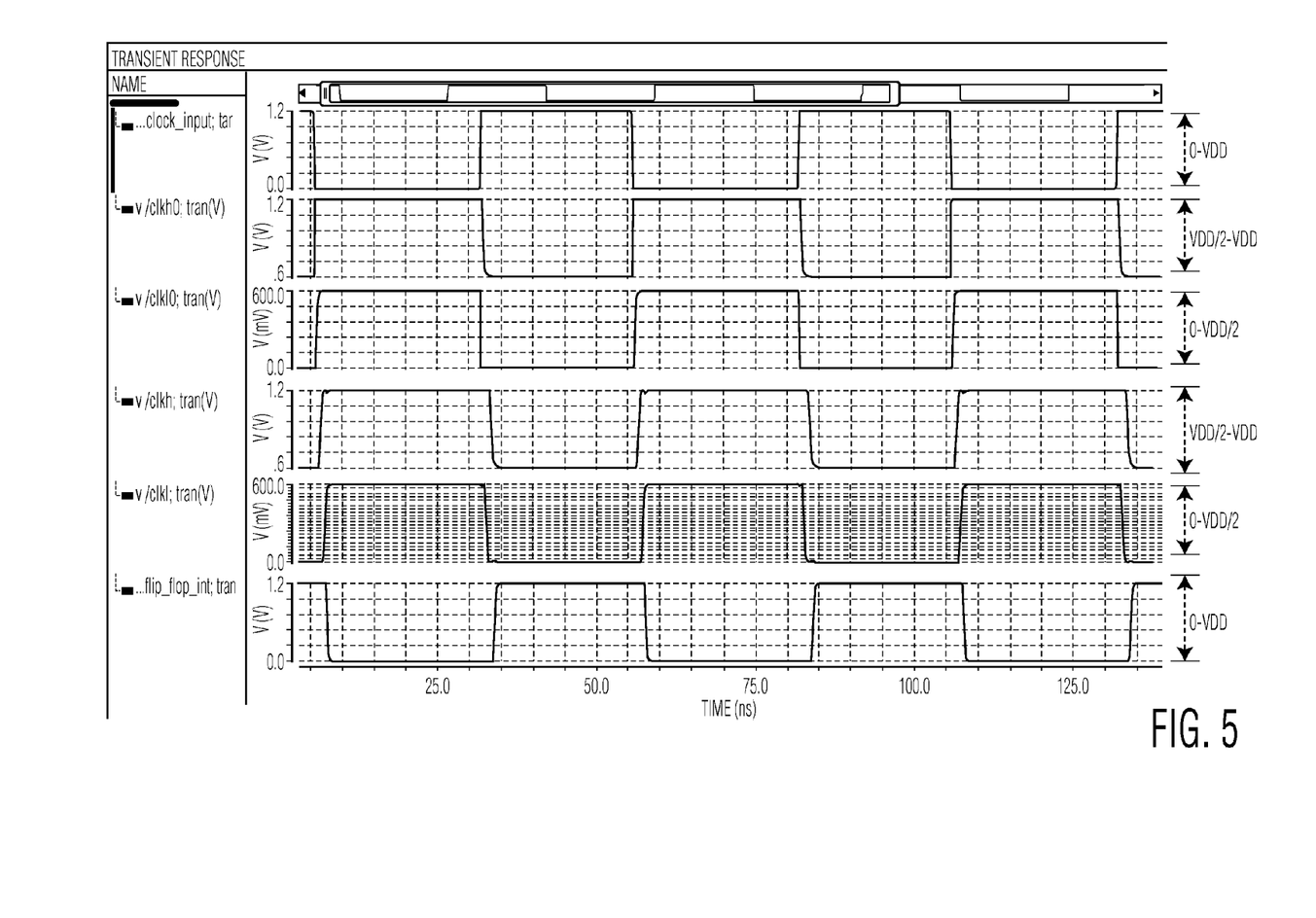
FIG. 5 illustrates some examples of clock signals of the IC device depicted in FIG. 4.

FIG. 5 illustrates example voltages of clock signals of the IC device 400 depicted in FIG. 4. Specifically, FIG. 5 shows a full-swing clock signal, "clock_input," generated by the clock source 408, half-swing clock signals, "clk10," and "clkh0," generated by the full-swing to half-swing converter 410, half-swing clock signals, "clk1," and "clkh," generated by the stacked clock driver circuit 404, and the full-swing clock signal, "flip-flop_int," generated by the half-swing to full-swing converter 416. As shown in FIG. 5, the signal swing on the clock lines is reduced as the input clock signal from the clock source is reduced to half of the VDD. Consequently, the total power consumption of the clock lines is reduced at least by 2. Additionally, because charge recycling is implemented in the stacked clock driver circuit, charge from one-half of the stacked clock driver circuit is predominantly used by the other half of the stacked clock driver circuit. Consequently, the power consumption in the clock line is further reduced.

Figure 6:
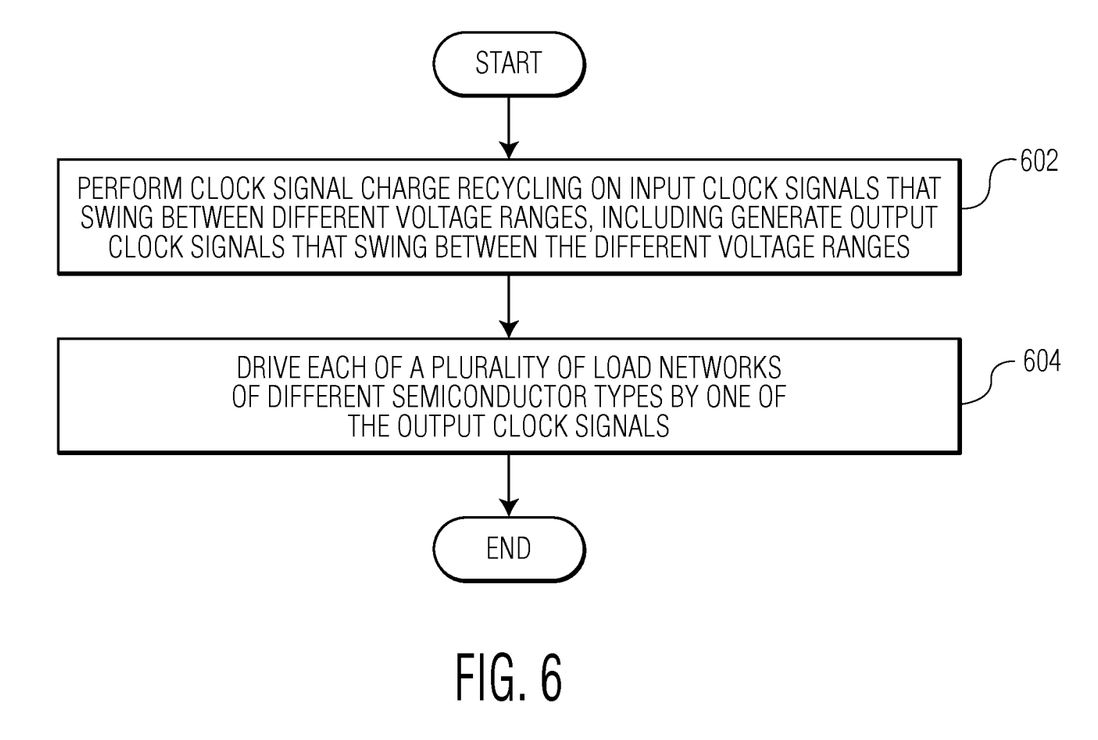
FIG. 6 is a process flow diagram that illustrates a method for clock distribution in accordance with an embodiment of the invention.

FIG. 6 is a process flow diagram that illustrates a method for clock distribution in accordance with an embodiment of the invention. At block 602, clock signal charge recycling is performed on input clock signals that swing between different voltage ranges. Output clock signals that swing between the different voltage ranges are generated. At block 604, each of load networks of different semiconductor types is driven by one of the output clock signals.

Figure 7:
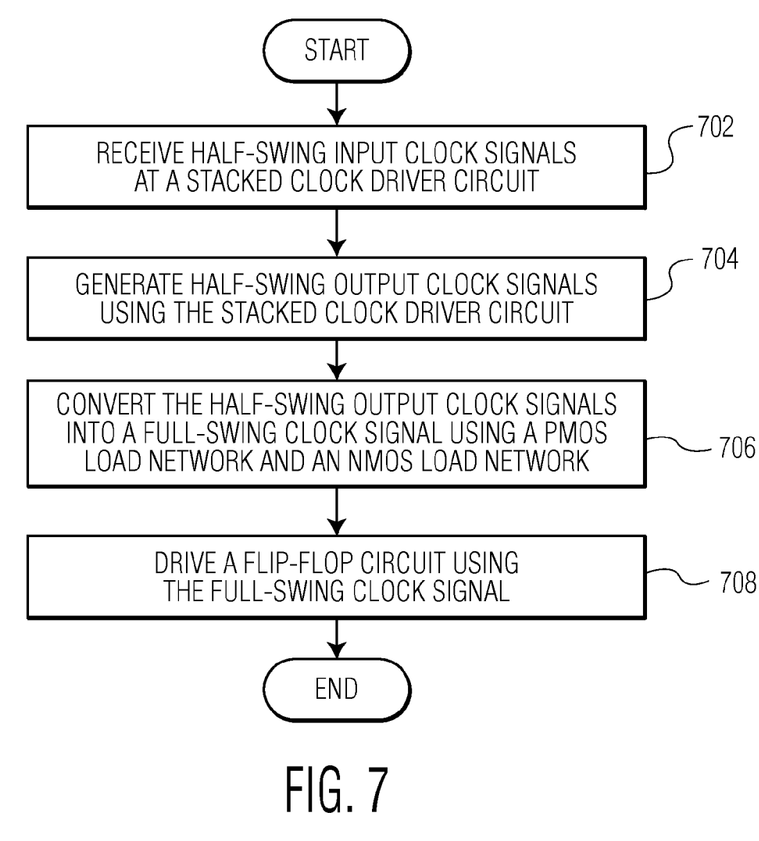
FIG. 7 is a process flow diagram that illustrates a method for clock distribution in accordance with another embodiment of the invention.

FIG. 7 is a process flow diagram that illustrates a method for clock distribution in accordance with another embodiment of the invention. At block 702, half-swing input clock signals are received at a stacked clock driver circuit (e.g., the stacked clock driver circuit 104 depicted in FIG. 1 or the stacked clock driver circuit 204 depicted in FIG. 2). The half-swing input clock signals may include a first half-swing input clock signal that swings between a voltage threshold and one half of the voltage threshold and a second half-swing input clock signal that swings between one half of the voltage threshold and zero. At block 704, half-swing output clock signals are generated using the stacked clock driver circuit. The half-swing output clock signals may include a first half-swing output clock signal that swings between the voltage threshold and one half of the voltage threshold and a second half-swing output clock signal that swings between one half of the voltage threshold and zero. At block 706, the half-swing output clock signals are converted into a full-swing clock signal using a PMOS load network (e.g., the PMOS network 320 depicted in FIG. 3) and an NMOS load network (e.g., the NMOS network 330 depicted in FIG. 3). Each PMOS transistor of the PMOS network may receive the first half-swing output clock signal while each NMOS transistor of the NMOS network may receive the second half-swing output clock signal. At block 708, a flip-flop circuit or other load component is driven using the full-swing clock signal.

Although the operations of the method herein are shown and described in a particular order, the order of the operations of the method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In addition, although specific embodiments of the invention that have been described or depicted include several components described or depicted herein, other embodiments of the invention may include fewer or more components to implement less or more features.

Furthermore, although specific embodiments of the invention have been described and depicted, the invention is not to be limited to the specific forms or arrangements of parts so described and depicted. The scope of the invention is to be defined by the claims appended hereto and their equivalents.

What is claimed is:

1. A clock distribution device, the clock distribution device comprising:
   a stacked clock driver circuit configured to perform clock signal charge recycling on input clock signals that swing between different voltage ranges, wherein the stacked clock driver circuit comprises a plurality of stacked driver circuits configured to generate output clock signals that swing between the different voltage ranges; and
   a load circuit comprising a plurality of load networks of different semiconductor types, wherein each of the load networks is configured to be driven by one of the output clock signals.

2. The clock distribution device of claim 1, wherein the stacked driver circuits comprises:
   a first-half driver circuit configured to receive a first input clock signal that swings between a voltage threshold and one half of the voltage threshold and to generate a first output clock signal that swings between the voltage threshold and one half of the voltage threshold; and
   a second-half driver circuit connected to the first-half driver circuit configured to receive a second input clock signal that swings between one half of the voltage threshold and zero and to generate a second output clock signal that swings between one half of the voltage threshold and zero.

3. The clock distribution device of claim 2, wherein the first-half driver circuit comprises a plurality of inverters that are coupled to a first supply voltage that is equal to the voltage threshold and a second supply voltage that is equal to one half of the voltage threshold.

4. The clock distribution device of claim 3, wherein the second-half driver circuit comprises a plurality of inverters that are coupled to the second supply voltage and ground.

5. The clock distribution device of claim 4, wherein each of the inverters of the first-half driver circuit and the second-half driver circuit comprises a PMOS transistor and an NMOS transistor.

6. The clock distribution device of claim 1, wherein the load networks are configured to convert the output clock signals from the stacked clock driver circuit into clock signals that swing between a voltage range that is larger than each of the different voltage ranges.

7. The clock distribution device of claim 6, wherein the output clock signals from the stacked clock driver circuit are half-swing signals while the converted clock signals are full-swing signals.

8. The clock distribution device of claim 6, wherein the output clock signals from the stacked clock driver circuit swing between a voltage threshold and one half of the voltage threshold and between one half of the voltage threshold and zero, and wherein the converted clock signals swing between the voltage threshold and zero.

9. The clock distribution device of claim 1, wherein the load networks comprise a PMOS load network and an NMOS load network.

10. The clock distribution device of claim 8, wherein the PMOS load network comprises at least one PMOS transistor, and wherein the NMOS load network comprises at least one NMOS transistor.

11. The clock distribution device of claim 8, wherein the PMOS load network comprises PMOS transistors coupled to a supply voltage that is equal to the voltage threshold, and wherein the NMOS load network comprises NMOS transistors coupled to ground.

12. The clock distribution device of claim 1, wherein the load networks only comprise a PMOS load network having only PMOS transistors and an NMOS load network having only NMOS transistors.

13. An integrated circuit (IC) device comprising the clock distribution device of claim 1 and a clock source circuit configured to generate the input clock signals of the stacked clock driver circuit.

14. The IC device of claim 13, wherein the clock source circuit comprises:
a full-swing clock source configured to generate full-swing clock signals; and
a full-swing to half-swing converter configured to convert the full-swing clock signals into the input clock signals of the stacked clock driver circuit, which are half-swing clock signals.

15. A method for clock distribution, the method comprising:
performing clock signal charge recycling on input clock signals that swing between different voltage ranges, comprising generating output clock signals that swing between the different voltage ranges; and
driving each of a plurality of load networks of different semiconductor types by one of the output clock signals.

16. The method for claim 15, wherein generating the output clock signals comprises:
receiving a first input clock signal that swings between a voltage threshold and one half of the voltage threshold and generating a first output clock signal that swings between the voltage threshold and one half of the voltage threshold; and
receiving a second input clock signal that swings between one half of the voltage threshold and zero and generating a second output clock signal that swings between one half of the voltage threshold and zero.

17. The method of claim 15, wherein driving each of the plurality of load networks comprises converting the output clock signals into clock signals that swing between a voltage range that is larger than each of the different voltage ranges.

18. The method of claim 17, wherein the output clock signals are half-swing signals while the converted clock signals are full-swing signals.

19. The method of claim 17, wherein the load networks comprise a PMOS load network and an NMOS load network.

20. A clock distribution device, the clock distribution device comprising:
a stacked clock driver circuit configured to perform clock signal charge recycling on input clock signals, wherein the stacked clock driver circuit comprises:
a first-half driver circuit configured to receive a first input clock signal that swings between a voltage threshold and one half of the voltage threshold and to generate a first output clock signal that swings between the voltage threshold and one half of the voltage threshold; and
a second-half driver circuit connected to the first-half driver circuit and configured to receive a second input clock signal that swings between one half of the voltage threshold and zero and generate a second output clock signal that swings between one half of the voltage threshold and zero; and
a load circuit comprising a PMOS load network having only PMOS transistors and an NMOS load network having only NMOS transistors, wherein the PMOS load network is configured to be driven by the first output clock signal, and wherein the NMOS load network is configured to be driven by the second output clock signal.

* * * * *